(12) United States Patent
Koren et al.

(10) Patent No.: US 8,001,445 B2
(45) Date of Patent: Aug. 16, 2011

(54) PROTECTED COMMUNICATION LINK WITH IMPROVED PROTECTION INDICATION

(75) Inventors: Shay Koren, Holon (IL); Jonathan Friedman, Tel Aviv (IL)

(73) Assignee: Provigent Ltd., Herzliya (IL)

( * ) Notice: Subject to any disclaimer, the term of this patent is extended or adjusted under 35 U.S.C. 154(b) by 1030 days.

(21) Appl. No.: 11/891,754

(22) Filed: Aug. 13, 2007

(65) Prior Publication Data

US 2009/0049361 A1 Feb. 19, 2009

(51) Int. Cl.
*H03M 13/00* (2006.01)

(52) U.S. Cl. .................. 714/780; 714/758; 714/755

(58) Field of Classification Search .................. 714/780, 714/758, 755
See application file for complete search history.

(56) References Cited

U.S. PATENT DOCUMENTS

| | | | |
|---|---|---|---|
| 4,288,658 A * | 9/1981 | Bieber et al. .................. 178/3 |
| 4,291,196 A * | 9/1981 | Spaniol et al. ................. 178/3 |
| 4,292,465 A * | 9/1981 | Wilson et al. .................. 178/3 |
| 4,310,813 A | 1/1982 | Yuuki et al. |
| 4,321,705 A | 3/1982 | Namiki |
| 4,367,555 A | 1/1983 | Namiki et al. |
| 4,397,022 A * | 8/1983 | Weng et al. .................. 714/783 |
| 4,438,530 A | 3/1984 | Steinberger |
| 4,479,258 A | 10/1984 | Namiki |
| 4,557,330 A | 12/1985 | Russell et al. |
| 4,575,862 A | 3/1986 | Tahara et al. |
| 4,606,054 A | 8/1986 | Amitay et al. |
| 4,627,045 A * | 12/1986 | Olson et al. .................. 370/225 |
| 4,631,734 A | 12/1986 | Foschini |
| 4,644,562 A | 2/1987 | Kavehrad et al. |
| 4,688,235 A | 8/1987 | Tahara et al. |
| 4,761,784 A | 8/1988 | Srinivasagopalan et al. |
| 4,857,858 A | 8/1989 | Tahara |
| 4,910,468 A | 3/1990 | Ohtsuka et al. |
| 4,914,676 A | 4/1990 | Iwamatsu et al. |
| 4,992,798 A | 2/1991 | Nozue et al. |
| 4,995,040 A * | 2/1991 | Best et al. .................. 714/797 |
| 5,023,620 A | 6/1991 | Matsuura |
| 5,068,667 A | 11/1991 | Mizoguchi |
| 5,075,697 A | 12/1991 | Koizumi et al. |
| 5,237,318 A | 8/1993 | Auclair et al. |

(Continued)

FOREIGN PATENT DOCUMENTS

EP 0454249 A1 10/1991

(Continued)

OTHER PUBLICATIONS

U.S. Appl. No. 11/634,781 Official Action dated Mar. 2, 2010.

(Continued)

*Primary Examiner* — Joseph D Torres

(74) *Attorney, Agent, or Firm* — D. Kligler I.P. Services Ltd.

(57) ABSTRACT

A method for communication includes receiving first and second data frames over first and second communication links, respectively, the first and second data frames containing respective first and second replicas of data, which has been encoded with a Forward Error Correction (FEC) code. The FEC code in the received first and second data frames is decoded, and respective first and second soft quality ranks of the first and second data frames are computed based on the decoded FEC code. One of the first and second replicas of the data are selected based on the first and second soft quality ranks. The selected one of the first and second replicas of the data is provided as output.

23 Claims, 4 Drawing Sheets

U.S. PATENT DOCUMENTS

| | | | |
|---|---|---|---|
| 5,241,320 A | 8/1993 | Mizoguchi | |
| 5,247,541 A | 9/1993 | Nakai | |
| 5,268,685 A | 12/1993 | Fujiwara | |
| 5,311,545 A | 5/1994 | Critchlow | |
| 5,311,546 A | 5/1994 | Paik et al. | |
| 5,313,467 A | 5/1994 | Varghese et al. | |
| 5,383,224 A | 1/1995 | Mizoguchi | |
| 5,406,589 A | 4/1995 | Iwamatsu et al. | |
| 5,432,522 A | 7/1995 | Kurokami | |
| 5,471,508 A | 11/1995 | Koslov | |
| 5,495,502 A | 2/1996 | Andersen | |
| 5,506,956 A * | 4/1996 | Cohen | 714/6.1 |
| 5,524,027 A | 6/1996 | Huisken | |
| 5,541,955 A | 7/1996 | Jacobsmeyer | |
| 5,614,914 A * | 3/1997 | Bolgiano et al. | 342/364 |
| 5,631,896 A | 5/1997 | Kawase et al. | |
| 5,663,990 A * | 9/1997 | Bolgiano et al. | 375/138 |
| 5,684,810 A * | 11/1997 | Nakamura et al. | 714/755 |
| 5,694,438 A * | 12/1997 | Wang et al. | 375/347 |
| 5,710,799 A | 1/1998 | Kobayashi | |
| 5,727,032 A | 3/1998 | Jamal et al. | |
| 5,742,640 A * | 4/1998 | Haoui et al. | 375/220 |
| 5,742,646 A | 4/1998 | Woolley et al. | |
| 5,809,070 A | 9/1998 | Krishnan et al. | |
| 5,838,224 A | 11/1998 | Andrews | |
| 5,838,740 A | 11/1998 | Kallman et al. | |
| 5,844,950 A | 12/1998 | Aono et al. | |
| 5,862,186 A * | 1/1999 | Kumar | 375/324 |
| 5,901,343 A | 5/1999 | Lange | |
| 5,905,574 A | 5/1999 | Vollbrecht et al. | |
| 5,920,595 A | 7/1999 | Iwamatsu | |
| 5,940,453 A | 8/1999 | Golden | |
| 5,987,060 A | 11/1999 | Grenon et al. | |
| 6,215,827 B1 | 4/2001 | Balachandran et al. | |
| 6,236,263 B1 | 5/2001 | Iwamatsu | |
| 6,252,912 B1 | 6/2001 | Salinger | |
| 6,262,994 B1 | 7/2001 | Dirschedl et al. | |
| 6,307,505 B1 * | 10/2001 | Green | 342/357.4 |
| 6,366,568 B1 * | 4/2002 | Bolgiano et al. | 370/320 |
| 6,418,164 B1 | 7/2002 | Endres et al. | |
| 6,452,964 B1 | 9/2002 | Yoshida | |
| 6,466,562 B1 | 10/2002 | Yoshida et al. | |
| 6,476,643 B2 * | 11/2002 | Hugues et al. | 326/93 |
| 6,490,243 B1 * | 12/2002 | Tanaka et al. | 370/216 |
| 6,501,953 B1 | 12/2002 | Braun et al. | |
| 6,611,942 B1 | 8/2003 | Battistello et al. | |
| 6,628,707 B2 | 9/2003 | Ratie et al. | |
| 6,647,059 B1 | 11/2003 | Faruque | |
| 6,665,810 B1 | 12/2003 | Sakai | |
| 6,678,259 B1 | 1/2004 | Schwengler | |
| 6,735,168 B1 * | 5/2004 | Schnell et al. | 370/217 |
| 6,763,374 B1 * | 7/2004 | Levi et al. | 709/217 |
| 6,826,238 B2 | 11/2004 | Ahn | |
| 6,829,298 B1 | 12/2004 | Abe et al. | |
| 6,836,515 B1 | 12/2004 | Kay et al. | |
| 6,836,791 B1 * | 12/2004 | Levi et al. | 709/217 |
| 6,842,444 B2 * | 1/2005 | Bolgiano et al. | 370/335 |
| 6,888,794 B1 | 5/2005 | Jovanovic et al. | |
| 6,915,463 B2 | 7/2005 | Vieregge et al. | |
| 6,920,189 B1 | 7/2005 | Spalink | |
| 6,954,504 B2 | 10/2005 | Tiedemann, Jr. et al. | |
| 6,993,024 B1 * | 1/2006 | McDermott et al. | 370/390 |
| 7,003,042 B2 | 2/2006 | Morelos-Zaragoza et al. | |
| 7,016,296 B2 | 3/2006 | Hartman, Jr. | |
| 7,046,753 B2 | 5/2006 | Resheff et al. | |
| 7,047,029 B1 | 5/2006 | Godwin et al. | |
| 7,127,669 B2 * | 10/2006 | Platenberg et al. | 714/820 |
| 7,133,425 B2 | 11/2006 | McClellan | |
| 7,133,441 B1 | 11/2006 | Barlev et al. | |
| 7,187,719 B2 | 3/2007 | Zhang | |
| 7,200,188 B2 | 4/2007 | Fague et al. | |
| 7,254,190 B2 | 8/2007 | Kwentus et al. | |
| 7,296,063 B2 * | 11/2007 | Levi et al. | 709/217 |
| 7,333,556 B2 | 2/2008 | Maltsev et al. | |
| 7,366,091 B1 | 4/2008 | Lahti et al. | |
| 7,415,548 B2 * | 8/2008 | Mahany et al. | 710/18 |
| 7,418,240 B2 | 8/2008 | Hsu et al. | |
| 7,460,583 B2 | 12/2008 | Khayrallah et al. | |
| 7,463,867 B2 | 12/2008 | Luo et al. | |
| 7,492,701 B2 | 2/2009 | Song et al. | |
| 7,630,509 B2 * | 12/2009 | Zarrabizadeh | 382/100 |
| 7,646,881 B2 * | 1/2010 | Zarrabizadeh | 382/100 |
| 7,653,055 B2 * | 1/2010 | Guo et al. | 370/389 |
| 7,770,097 B2 * | 8/2010 | Platenberg et al. | 714/807 |
| 7,839,952 B2 * | 11/2010 | Sofer et al. | 375/299 |
| 2001/0017897 A1 | 8/2001 | Ahn | |
| 2002/0016933 A1 | 2/2002 | Smith et al. | |
| 2002/0051498 A1 | 5/2002 | Thomas et al. | |
| 2002/0061752 A1 | 5/2002 | Kurokami | |
| 2002/0161851 A1 | 10/2002 | Chang | |
| 2002/0181490 A1 | 12/2002 | Frannhagen et al. | |
| 2003/0021370 A1 | 1/2003 | Menkhoff | |
| 2003/0043778 A1 | 3/2003 | Luschi et al. | |
| 2003/0056158 A1 | 3/2003 | Yue | |
| 2003/0066082 A1 | 4/2003 | Kliger et al. | |
| 2003/0135532 A1 | 7/2003 | Peting | |
| 2003/0185319 A1 | 10/2003 | Kolze | |
| 2003/0203721 A1 | 10/2003 | Berezdivin et al. | |
| 2004/0017860 A1 | 1/2004 | Liu | |
| 2004/0063416 A1 | 4/2004 | Kuenen et al. | |
| 2004/0076240 A1 | 4/2004 | Wang et al. | |
| 2004/0081081 A1 | 4/2004 | Colombo | |
| 2004/0086668 A1 | 5/2004 | Dronzek et al. | |
| 2004/0151108 A1 | 8/2004 | Blascoet et al. | |
| 2004/0198296 A1 | 10/2004 | Hui et al. | |
| 2004/0217179 A1 | 11/2004 | Garner | |
| 2005/0002474 A1 | 1/2005 | Limberg | |
| 2005/0010853 A1 | 1/2005 | Duvant et al. | |
| 2005/0063496 A1 | 3/2005 | Guillouard et al. | |
| 2005/0075078 A1 | 4/2005 | Makinen et al. | |
| 2005/0123073 A1 | 6/2005 | Ginesi et al. | |
| 2005/0149844 A1 | 7/2005 | Tran et al. | |
| 2005/0169401 A1 | 8/2005 | Abraham et al. | |
| 2005/0190868 A1 | 9/2005 | Khardekar et al. | |
| 2005/0239398 A1 | 10/2005 | Lai | |
| 2005/0265436 A1 | 12/2005 | Suh et al. | |
| 2005/0286618 A1 | 12/2005 | Abe | |
| 2006/0008018 A1 | 1/2006 | Kolze | |
| 2006/0013181 A1 | 1/2006 | Stoplman et al. | |
| 2006/0056554 A1 | 3/2006 | Lin et al. | |
| 2006/0093058 A1 | 5/2006 | Skraparlis | |
| 2006/0107179 A1 | 5/2006 | Shen et al. | |
| 2006/0193400 A1 | 8/2006 | Morris et al. | |
| 2006/0203943 A1 | 9/2006 | Scheim et al. | |
| 2006/0209939 A1 | 9/2006 | Mantha | |
| 2007/0076719 A1 | 4/2007 | Allan et al. | |
| 2007/0116143 A1 | 5/2007 | Bierke et al. | |
| 2007/0116162 A1 | 5/2007 | Eliaz et al. | |
| 2007/0133397 A1 | 6/2007 | Bianchi et al. | |
| 2007/0153726 A1 | 7/2007 | Bar-Sade et al. | |
| 2007/0230641 A1 | 10/2007 | Yehudai | |
| 2008/0002581 A1 | 1/2008 | Gorsetman et al. | |
| 2008/0008257 A1 | 1/2008 | Yonesi et al. | |
| 2008/0037675 A1 | 2/2008 | Lin et al. | |
| 2008/0043829 A1 | 2/2008 | Shiue et al. | |
| 2008/0080634 A1 | 4/2008 | Kotecha et al. | |
| 2008/0130616 A1 | 6/2008 | Wengerter et al. | |
| 2008/0130726 A1 | 6/2008 | Sofer et al. | |
| 2008/0137779 A1 | 6/2008 | Valadon | |
| 2008/0155373 A1 | 6/2008 | Friedman et al. | |
| 2008/0254749 A1 | 10/2008 | Ashkenazi et al. | |
| 2008/0259901 A1 | 10/2008 | Friedman et al. | |
| 2009/0022239 A1 | 1/2009 | Kimura et al. | |
| 2009/0092208 A1 | 4/2009 | Montekyo et al. | |

FOREIGN PATENT DOCUMENTS

| | | |
|---|---|---|
| EP | 1365519 A1 | 11/2003 |
| JP | 6021762 A | 1/1994 |
| JP | 9064791 A | 3/1997 |
| JP | 2000115244 A | 4/2000 |
| JP | 200161187 A | 3/2001 |
| JP | 2001-217761 A | 8/2001 |
| JP | 2002-9861 A | 1/2002 |
| JP | 2002345023 A | 11/2002 |
| JP | 2003068228 A | 3/2003 |
| JP | 2004179821 A | 6/2004 |
| JP | 2004179893 A | 6/2004 |

| | | | |
|---|---|---|---|
| JP | 2005269530 A | 9/2005 | |
| JP | 2005333473 A | 12/2005 | |
| JP | 2007250050 A | 9/2007 | |
| JP | 2008033069 A | 2/2008 | |
| WO | 0060802 A1 | 10/2000 | |
| WO | 0077952 A1 | 12/2000 | |
| WO | WO 00/76114 | 12/2000 | |
| WO | 0154339 A1 | 7/2001 | |
| WO | 2004086668 A1 | 10/2004 | |
| WO | 2005122414 A1 | 12/2005 | |
| WO | 2006097735 A2 | 9/2006 | |
| WO | 2006118892 A1 | 11/2006 | |
| WO | 2007040906 A2 | 4/2007 | |

OTHER PUBLICATIONS

U.S. Appl. No. 11/787,059 Official Action dated Mar. 3, 2010.
U.S. Appl. No. 11/394,172 Official Action dated Mar. 2, 2010.
U.S. Appl. No. 11/973,464 Official Action dated Sep. 30, 2010.
American National Standard T1.105-2001, "Synchronous optical network (SONET)—basic description including multiplex structure, rates and format", Alliance for Telecommunications Industry Solutions, 2001.
Benani et al., "Comparison of Carrier Recovery Techniques in M-QAM Digital Communications Systems", Proceedings of 13th Annual Canadian Conference on Electrical and Computer Engineering, pp. 73-77, Halifax, Canada, Mar. 7-10, 2000.
Best R., "Phase Locked Loops: Design, Simulation, and Applications", McGraw Hill Professional, 5th Edition, pp. 81-92, Jun. 20, 2003.
Dr. Lin-Nan Lee, "LPDC Codes, Application to Next Generation Communication Systems", Hughes Network System Oct. 8, 2003.
ITU Recommendation G.703 , "General Aspects of Digital Transmission Systems-Terminal Equipments-Physical/Electrical Characteristics of Hierarchical Digital Interfaces", Geneva, Switzerland 1991.
ITU Recommendation G.704, "Series G: Transmission Systems and Media, Digital Systems and Networks, Digital Transmission Systems-Terminal Equipments-General, Synchronous Frame Structures used at 1544, 6312, 2048, 8448 and 44736 kbit/s hierarchical levels", Oct. 1998.
Gagnon et al., "A Simple and Fast Carrier Recovery Algorithm for High-Order QAM", IEEE Communications Letters, vol. 9, No. 10, pp. 918-920, Oct. 2005.
GR-253-CORE by Telcordia Technologies, "Synchronous optical network (SONET) transport systems: common criteria" Issue 3, Sep. 2000.
Hassan K., "LPDC encoded pilots for iterative receiver improvement", Thesis submiteed to the College Engineering of Wichita State University, Dec. 2005.
Ericsson AB, "Capacity without ties; Mini-Link microwave transmission solution", EN/LZT 712 0117 R2, Molndal, Sweden, 2005.
ITU Recommendation G.707/Y.1322, "Series G: Transmission systems and media, digital systems and networks, digital terminal equipments -general: Series Y: global information infrastructure and internet protocol aspects—transport; Network node interface for the syncronours digital hierarchy (SDH)", Oct. 2000.
ITU Recommendation G.783, "General Aspects of Digital Transmission Systems: Terminal Equipments—Characteristics of Syncronous Digital Hierarchy (SDH) Equipment Functional Blocks", Jan. 1994.
Johnson et al., "Blind Equalization Using the Constant Modulus Criterion: A Review", Proceedings of the IEEE, vol. 86, No. 10, Oct. 1998.
Kim et al., "Design of Carrier Recovery Algorithm for High-Order QAM with Large Frequency Acquisition Range", IEEE Internatinal Conference on Communications (ICC), pp. 1016-1020, vol. 4, Helsinki, Finland, Jun. 11-14, 2001.
Kschischang F., "Capacity Approching Codes, Iterative Decoding Algorithms and Their Application: Codes defined on Graphs", IEEE Communications Magazine, pp. 118-125, Aug. 2003.
Richardson etr al., "Capacity Approaching codes; Iterative Decoding Algorithms and Their Application: The Renaissance of Gallager's Low-Densityy parity Check Codes", IEEE Communications Magazine, pp. 126-131, Aug. 2003.

Riegel M., "Requirements for edge-to edge estimation of time deivision multiplexed (TDM) circuits over packet switching networks", IETF Network Working Group, RFC 4197, Oct. 2005.
Satorius et al., "Adaptive modulation and coding techniques in MUOS fading/scintillation environments", Proceedings of the IEEE Military Communications Conference, Anaheim, USA, vol. 1, pp. 321-327, Oct. 7-10, 2002.
Standard T1.102-1993 of the ANSI, "American National Standard for Telecommunications-Digital Hierarchy-Electrical Interfaces", Dec. 1993.
U.S. Appl. No. 11/285,414 Official Acrtion dated Mar. 6, 2009.
U.S. Appl. No. 11/285,414 Official Action dated May 23, 2008.
U.S. Appl. No. 11/285,414 Official Action dated Nov. 12, 2008.
U.S. Appl. No. 11/394,172 Official Action dated Jan. 21, 2009.
U.S. Appl. No. 11/394,172 Official Action dated Jun. 16, 2008.
U.S. Appl. No. 11/394,172 Official Action dated Jun. 26, 2009.
U.S. Appl. No. 11/479,050 Official Action dated Jul. 24, 2009.
U.S. Appl. No. 11/479,050 Official Action dated Mar. 4, 2009.
U.S. Appl. No. 11/483,078 Official Action dated Mar. 27, 2009.
U.S. Appl. No. 11/483,078 Official Action dated Jun. 2, 2008.
U.S. Appl. No. 11/483,078 Official Action dated Nov. 12, 2008.
International Application PCT/IL2006/001344 Search Report dated Mar. 13, 2008.
International Application PCT/IL2007/000326 Search Report dated Aug. 1, 2008.
International Application PCT/IL2007/000812 Search Report dated Jun. 4, 2008.
International Application PCT/IL2007/001410 Search Report dated Jan. 26, 2009.
International Application PCT/IL2008/001321 Search Report dated Feb. 19, 2009.
International Application PCT/IL2008/000453 Search Report dated Jun. 17, 2009.
Chinese Application No. 200580028811.1 Official Action dated Dec. 5, 2008.
European Application No. 08290290.9 Official Action dated Jun. 18, 2009.
European Application No. 08290290.9 Search Report dated Oct. 15, 2008.
Japanese Application No. 2007518808 Official Action dated Jan. 29, 2009.
Japanese Application No. 2007518808 Official Action dated Jun. 4, 2008.
Mielczarek&Svensson, "Phase offset estimation using enhanced turbo decoders," Proceedings of the IEEE International Conference on Communications, New York, New York, New York, Apr. 28-May 2, 2002, vol. 3, pp. 1536-1540.
Mielczarek&Svensson, "Improving phase estimation with enhanced turbo decoders," PCC Workshop, Nynashamn, Sweden, 2001.
Gallager, "Low-Density Parity-Check Codes", IRE Transactions on Information Theory, vol. 7, Jan. 1962, pp. 21-28.
Ryan and Vasic "An Introduction to LDPC Codes", GlobeCom 2003, San Francisco, California, Dec. 5, 2003.
Worthen and Stark, "Unified Design of Iterative Receivers using Factor Graphs", IEEE Transactions on Information Theory, (47:2), Feb. 2001, pp. 843-849.
Richardson and Urbanke, "An Introduction to the Analysis of Iterative Coding Systems", Proceedings of the 1999 Institute for Mathematics and its Applications (IMA) Summer Program: Codes, Systems and Graphical Models, Minneapolis, Minnesota, Aug. 2-6, 1999.
Pottle and Taylor, "Multilevel Codes Based on Partitioning", IEEE Transactions on Information Theory (35:1), Jan. 1989, pp. 87-98.
Hideki, et al., "A New Multilevel Coding Method Using Error-Correcting Codes", IEEE Transactions on Information Theory, vol. IT-23, No. 3, 1977.
A.R. Calderbank, "Multilevel Codes and Multistage Decoding", IEEE Transactions on Communications, vol. 37, No. 3, Mar. 1989.
Huaning Niu, et al., "Iterative Channel Estimation and LDPC Decoding over Flat-Fading Channels: A Factor Graph Approach", 2003 Conference on Information Sciences and Systems, The Johns Hopkins University, Mar. 12-14, 2003.

Xiaowei Jin, et al., "Analysis of Joint Channel Estimation and LDPC Decoding on Block Fading Channels", International Symposium on Information Theory and its Applications, ISITA2004, Parma, Italy, Oct. 10-13, 2004.

Jian Sun, "An Introduction to Low Density Parity Check (LDPC) Codes", West Virginia University, Jun. 3, 2003.

A. Saroka, et al., "Joint carrier phase estimation and turbo decoding using bit-carrier-phase APP decoder", 2004.

G. Colavolpe, et al., "Algorithms for iterative decoding in the presence of strong phase noise", IEEE Journal on Selected Areas in Communications, (23:9), Sep. 2005, pp. 1748-1757.

Dennis L. Goeckel, "Adaptive coding for time-varying channels using outdated fading estimates", IEEE Transactions on communications, vol. 47, No. 6, Jun. 1999.

Duel-Hallen, et al., "Long range prediction of fading signals: enabling adaptive transmission for mobile radio channels", IEEE signal processing magazine, 17:3, May 2000, pp. 62-75.

Hu, et al., "Adaptive modulation using long range prediction for flat Rayleigh fading channels", Proceedings of the IEEE International Symposim on Information Theory, Sorrento, Italy, Jun. 25-30, 2000.

U.S. Appl. No. 11/787,059 Official Action dated Jul. 9, 2010.

U.S. Appl. No. 11/634,781 Official Action dated Sep. 21, 2009.

U.S. Appl. No. 11/645,828 Official Action dated Sep. 15, 2009.

Japanese Patent Application # 2007-172513 Official Action dated Jul. 5, 2010 (with translation).

European Patent Application # 08738160.4 Search Report dated Aug. 26, 2010.

Diaz et al., "The Use of Coding and Diversity Combining for Mitigating Fading Effects in a DS/CDMA System", IEEE Transactions on Vehicular Technology, vol. 47, No. 1, pp. 95-102, Feb. 1, 1998.

Lampe et al., "Misunderstandings about Link Adaptation for Frequency Selective Fading Channels", 13th IEEE International Symposium on Personal, Indoor and Mobile Radio Communications, vol. 2, pp. 710-714, Sep. 15-18, 2002.

Nishimura et al., "Dynamic Rate Control for Mobile Multimedia Communication", Proceedings of the 1998 Communications Society Conference of IEICE, Sep. 29-Oct. 2, 1998 (abstract).

Japanese Patent Application # 2007-313885 Official Action dated Feb. 10, 2011.

U.S. Appl. No. 11/973,464 Official Action dated Feb. 7, 2011.

Japanese Patent Application # 2007-172513 Official Action dated Jan. 4, 2011.

Chinese Patent Application # 200580028811.1 Official Action dated Apr. 25, 2011.

European Patent Application # 06809892.0 Search Report dated Apr. 24, 2011.

Chinese Patent Application # 200780025545.6 Official Action dated Mar. 24, 2011.

* cited by examiner

PROTECTED COMMUNICATION LINK WITH IMPROVED PROTECTION INDICATION

FIELD OF THE INVENTION

The present invention relates generally to communication systems, and particularly to methods and systems for operating protected communication links.

BACKGROUND OF THE INVENTION

Some communication systems transmit and receive data over redundant communication links, in order to improve error performance and provide protection against equipment failures and adverse channel conditions. For example, U.S. Pat. No. 6,611,942, whose disclosure is incorporated herein by reference, describes a method of protecting the transmission of cells in a telecommunication system. On the transmitter side, two identical flows of cells are transmitted on two distinct physical links. Cells serving as markers, and thus delimiting blocks of cells or sets of blocks of cells, are inserted regularly into each of the flows at the transmitter. On the receiver side, the two flows of cells are received and the block or group of blocks from the flow having the fewer transmission errors is selected.

U.S. Pat. No. 5,631,896, whose disclosure is incorporated herein by reference, describes a path switching method without bit loss. The same digital line signals on a working path and on a protection path are continuously monitored independently for bit errors. If a bit error occurs in the working path and no bit error occurs in the protection path, a switching trigger is produced and a switching operation from the working path to the protection path is performed on a data block basis. Only correct data are transferred to downstream apparatuses. The method uses data blocks of one frame length with an indicator for bit error checking placed at the beginning or top of the block.

SUMMARY OF THE INVENTION

Embodiments of the present invention provide a method for communication, including:

receiving first and second data frames over first and second communication links, respectively, the first and second data frames containing respective first and second replicas of data, which has been encoded with a Forward Error Correction (FEC) code;

decoding the FEC code in the received first and second data frames;

computing respective first and second soft quality ranks of the first and second data frames based on the decoded FEC code;

selecting one of the first and second replicas of the data based on the first and second soft quality ranks; and outputting the selected one of the first and second replicas of the data.

In some embodiments, the first communication link serves as a primary link, and the second communication link serves as backup to the primary link. In another embodiment, the data in the first and second data frames is further encoded with an error detection code, and computing the first and second soft quality ranks includes computing the ranks based on both the decoded FEC code and on the error detection code. The error detection code may include a Cyclic Redundancy Check (CRC). The FEC code may include a Reed Solomon code.

In a disclosed embodiment, selecting the one of the first and second replicas includes selecting the first replica when the first soft quality rank is better than the second soft quality rank, and selecting the second replica when the second soft quality rank is better than the first soft quality rank. In another embodiment, selecting the one of the first and second replicas includes changing a currently-selected replica when a respective soft quality rank of the currently selected replica violates a predetermined threshold.

In yet another embodiment, the first and second soft quality ranks are based on indications derived respectively from the first and second data frames, the indications including at least one indication type selected from a group of types consisting of successful/failed decoding of the FEC code, a number of errors present before decoding the FEC code and a number of bytes containing the errors present before decoding the FEC code.

In still another embodiment, computing the soft quality ranks and selecting the one of the first and second replicas include:

when at least one of the first and second replicas does not contain errors before decoding of the FEC code, selecting one of the replicas that does not contain errors; and when both the first and the second replicas contain errors before decoding of the FEC code, selecting the one of the first and second replicas that is closer to a valid codeword of the FEC code.

In an embodiment, selecting the one of the first and second replicas that is closer to the valid codeword includes selecting the one of the first and second replicas having a smaller number of the errors. Additionally or alternatively, selecting the one of the first and second replicas that is closer to the valid codeword includes selecting the one of the first and second replicas having a smaller number of bytes containing the errors. In some embodiments, computing the soft quality ranks includes computing the ranks responsively to a comparison between inputs of first and second decoders that respectively decode the FEC code in the first and second data frames to respective outputs of the decoders.

There is additionally provided, in accordance with an embodiment of the present invention, a communication apparatus, including:

first and second receivers, which are arranged to receive first and second data frames over first and second communication links, respectively, the first and second data frames containing respective first and second replicas of data, which has been encoded with a Forward Error Correction (FEC) code, and to decode the FEC code in the received first and second data frames;

a multiplexer (MUX), which is operative to receive the first and second data frames from the first and second receivers and to select one of the first and second data frames, so as to provide a respective one of the first and second replicas of the data as output; and a controller, which is coupled to compute respective first and second soft quality ranks of the first and second data frames based on the decoded FEC code, and to control the MUX to select the one of the first and second replicas of the data based on the first and second soft quality ranks.

There is further provided, in accordance with an embodiment of the present invention, a communication link, including:

a transmitter, which is arranged to encode data with a Forward Error Correction (FEC) code and to transmit first and second replicas of the encoded data in respective first and second data frames over first and second communication channels; and a receiver, including:

first and second receiver channels, which are respectively arranged to receive the first and second data frames transmitted by the transmitter, and to decode the FEC code in the received first and second data frames;

a multiplexer (MUX), which is operative to receive the first and second data frames from the first and second receiver channels and to select one of the first and second data frames, so as to provide a respective one of the first and second replicas of the data as output; and a controller, which is coupled to compute respective first and second soft quality ranks of the first and second data frames based on the decoded FEC code, and to control the MUX to select the one of the first and second replicas of the data based on the first and second soft quality ranks.

The present invention will be more fully understood from the following detailed description of the embodiments thereof, taken together with the drawings in which:

DETAILED DESCRIPTION OF EMBODIMENTS

Overview

Figure 1:
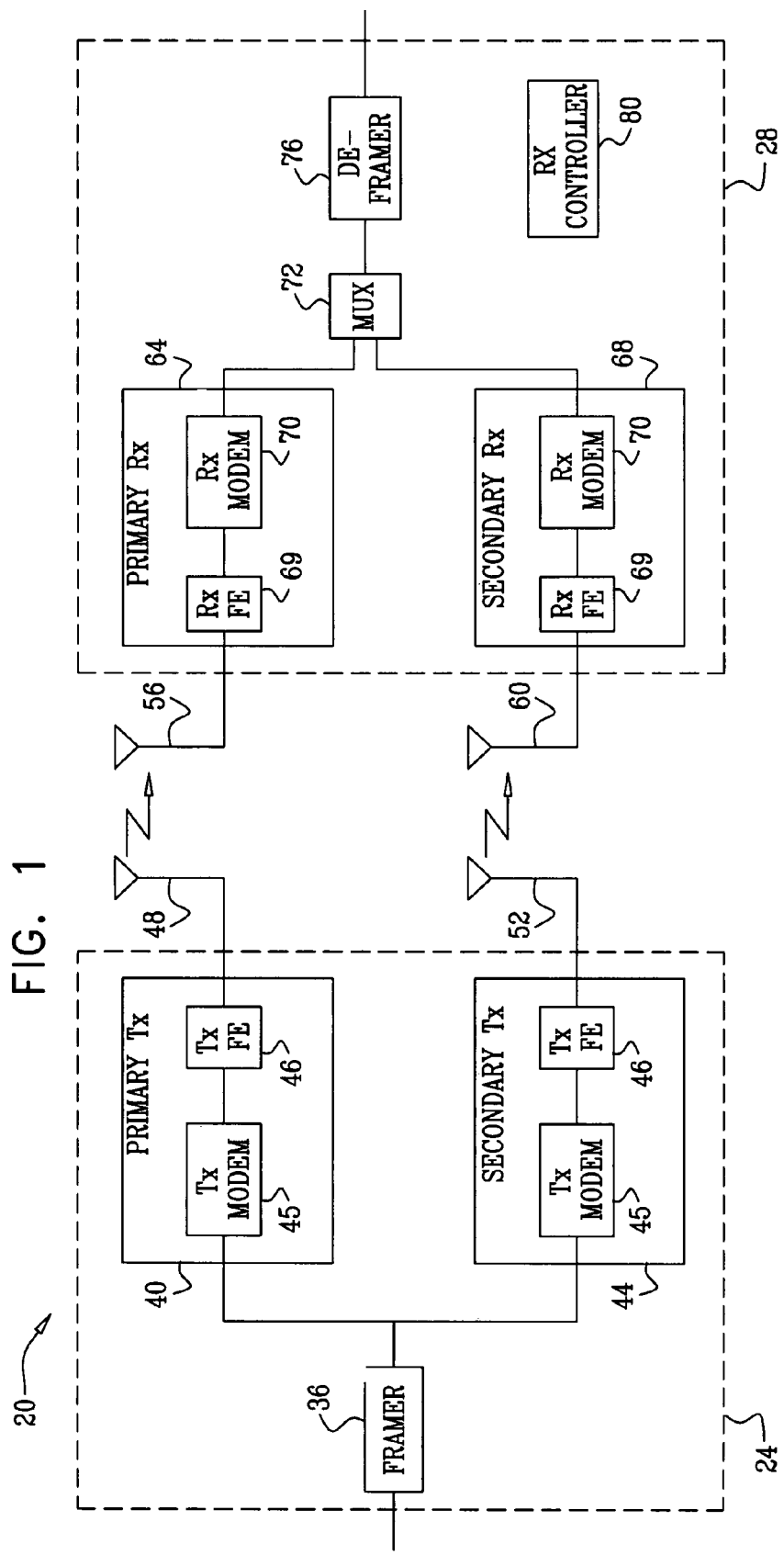
FIG. 1 is a block diagram that schematically illustrates a protected communication link, in accordance with an embodiment of the present invention.

In some protected link configurations that use Forward Error Correction (FEC) codes, switching between the primary and secondary links is based on indications regarding the success or failure of decoding the FEC code. In many practical cases, however, these indications are often inaccurate or unreliable and may result in sub-optimal or even erroneous selection decisions. FEC code indications tend to be particularly undependable when the FEC code rate is high, when the links operate under difficult channel conditions and/or when multi-level FEC coding is used.

In view of the unreliability that is sometimes associated with FEC code indications, embodiments of the present invention provide improved methods and systems for switching between redundant links in protected link configurations. In the embodiments that are described hereinbelow, switching decisions are based on soft quality ranks that are related to the FEC code. The term "soft quality rank" is used to describe any rank or metric having a resolution or granularity that is finer than one bit, i.e., finer than a mere binary pass/fail indication. The soft quality ranks are typically represented by binary numbers having two or more bits.

In some embodiments, a transmitter transmits identical replicas of data to a receiver over primary and secondary communication links, in respective sequences of data frames. The data in each data frame is encoded with a FEC code. The two parallel sequences of data frames are received by the receiver, which decodes the FEC code. The receiver comprises a multiplexer (MUX), which is switched to select the data frames of one of the primary and secondary links, typically on a frame-by-frame basis. The data is extracted from the selected data frames and provided as output.

The MUX is controlled by a controller, which computes a soft quality rank for each data frame based on the decoding performance of the FEC code. For a given pair of parallel data frames (i.e., data frames received over the primary and secondary links carrying the same data), the controller compares the soft quality ranks of the two frames, and selects the data frame having the better soft quality rank. Several exemplary quality ranks and selection criteria are described further below.

In some embodiments, the data transmitted over the primary and secondary links is encoded with an error detection code, such as a Cyclic Redundancy Check (CRC), in addition to the FEC. As will be shown below, although the error detection code does not correct errors, it is often able to provide reliable quality indications even when the FEC code fails to do so. In these embodiments, the controller computes the soft quality ranks based on both the FEC and the error detection code. Note that allocating link resources (e.g., transmission time or bandwidth) to the error detection code usually comes at the expense of some performance degradation, since other link parameters (e.g., symbol rate or FEC code rate) are compromised. In most cases, however, this degradation is more than compensated for by the performance improvement caused by better switching decisions. The overall link performance is thus considerably improved.

Unlike known protection methods in which the selection between the primary and secondary links is based on a binary indication, e.g., on the presence or absence of errors, the methods and systems described herein can determine which of the two links perform better, even when both links contain errors. Thus, the disclosed quality ranks and selection methods improve the overall error performance of the protected link.

System Description

FIG. 1 is a block diagram that schematically illustrates a protected communication link 20, in accordance with an embodiment of the present invention. In the present example, link 20 comprises a point-to-point microwave or millimeter wave link. In alternative embodiments, link 20 may comprise any other suitable wireless link. In order to protect the data transmitted over the link, link 20 comprises a primary link and a secondary link, over which the data is transferred in parallel.

Link 20 comprises a dual transmitter 24, which transmits the data to a dual receiver 28. Data entering the dual transmitter is formatted and encapsulated in data frames by a framer 36. The data frames are provided in parallel to a primary transmitter 40 and a secondary transmitter 44. Each transmitter comprises a transmit (TX) modem 45, which encodes the data using a Forward Error Correction (FEC) code and an error detection code, and modulates the encoded data. Typically but not necessarily, the FEC code comprises a block code, and the data of each data frame corresponds to a single FEC block. The FEC code may comprise, for example, a Reed-Solomon (RS) code, a Low Density Parity Check (LDPC) code or any other suitable FEC code. The error detection code may comprise any suitable scheme that enables detection of errors, such as a Cyclic Redundancy Check (CRC) or various parity or checksum schemes.

In each of the primary and secondary transmitters, a transmitter front end (TX FE) 46 converts the modulated digital signal produced by the TX modem to an analog signal, and then filters and up-converts the signal to a suitable Radio Frequency (RF) and performs power amplification. The primary and secondary transmitters transmit the respective RF signals via transmit antennas 48 and 52, respectively.

The data transmitted by transmitters 40 and 44 is identical. Therefore, in alternative embodiments, dual transmitter 24 may comprise only a single TX modem 45, whose output is provided in parallel to two TX front ends 46 of the primary and secondary transmitters.

The signals transmitted by the primary and secondary transmitters respectively traverse primary and secondary wireless communication channels. The two channels differ from one another in frequency, polarization and/or antenna position. Since the two channels typically have different characteristics and conditions, poor channel conditions that may cause transmission errors are unlikely to be correlated between the channels. Thus, the two channels provide a certain amount of communication diversity and protection.

The signals transmitted over the primary and secondary channels are respectively received by receive antennas 56 and 60 and provided to a primary receiver 64 and a secondary receiver 68 in dual receiver 28. Receivers 64 and 68 process the received signals to reconstruct the transmitted data frames. Primary TX 40, antennas 48 and 56, and primary RX 64 are referred to as the primary link. Secondary TX 44, antennas 52 and 60, and secondary RX 68 are referred to as the secondary link.

Each of receivers 64 and 68 comprises a receiver front end (RX FE) 69, which down-converts, filters and digitizes the received RF signal. The RX FE may also perform functions such as gain control. The digital signal produced by the RX FE is provided to a receive (RX) modem 70, which demodulates the signal and decodes the FEC and error detection codes. The modem may also perform functions such as synchronization and carrier recovery.

Each of receivers 64 and 68 provides the reconstructed data frames to a multiplexer (MUX) 72, typically comprising a switch matrix. Thus, MUX 72 is provided with two parallel sequences of data frames, which were received over the primary and secondary links and carry the same data. The output of MUX 72 is de-formatted by a de-framer 76, which extracts the data from the data frames and provides the data as output. Thus, the setting of MUX 72 selects whether the data transmitted over the primary or the secondary link is to be used as output. Typically, MUX 72 comprises a high-speed switching matrix that is able to alternate between the primary and secondary receivers on a frame-by-frame basis.

Dual receiver 28 comprises a controller 80, which controls the operation of the receiver. In particular, controller 80 determines the appropriate setting of MUX 72, i.e., whether to use the data from the primary or secondary receiver, and controls MUX 72 accordingly. Controller 80 selects between the primary and secondary receivers based on indications related to the FEC code, and optionally to the error detection code, which are provided by RX modems 70 in the two receivers.

The frame-by-frame selection provides protection against failure in one of the links. Even when both links are operational, the selection enables the dual receiver to choose the link having the better performance (e.g., lower bit error rate), providing an overall improvement of performance. The switching operation is often hitless, i.e., performed without loss of data.

Typically, each RX modem 70 produces indications related to the progress, success and/or quality of decoding of the FEC and error detection codes per each received data frame. These indications are provided to controller 80. The controller computes a soft quality rank for each data frame, based on the indications provided by the modems. For a given pair of parallel data frames (i.e., a data frame received by the primary receiver and a data frame received by the secondary receiver carrying the same data), the controller compares the soft quality ranks of the two frames, and sets MUX 72 to select the data frame having the better rank. Several exemplary quality ranks and selection criteria are described further below.

In some embodiments, controller 80 selects the better-performing data frame on a frame-by-frame basis, i.e., regardless of the selection of previous frames. Alternatively, the controller may apply any other suitable logic based on the soft quality ranks. For example, in some embodiments a minimum threshold is defined for the soft quality rank. The controller selects the data frames of the primary link, as long as their quality ranks are higher than the threshold. When the quality ranks of the data frames of the primary link drop below the threshold, the controller switches MUX 72 to select the data frames of the secondary link, provided their quality ranks have higher values.

Note that the definition of the two links as primary and secondary may be arbitrary and may change with time. For example, at any given time, the link whose frames are currently selected can be regarded as being the primary link, and the other link defined as the secondary link and serves as backup. When controller 80 begins to select the frames of the other link, the link roles may be reversed.

Typically, controller 80 comprises a general-purpose processor, which is programmed in software to carry out the functions described herein. The software may be downloaded to the processor in electronic form, over a network or over link 20, for example, or it may alternatively be supplied to the processor on tangible media, such as CD-ROM.

Some additional aspects of protection switching, referring in particular to links having variable data rates, are described in U.S. patent application Ser. No. 11/634,781, filed Dec. 5, 2006, entitled "Data Rate Coordination in Protected Variable-Rate Links," which is assigned to the assignee of the present patent application and whose disclosure is incorporated herein by reference.

Figure 2:
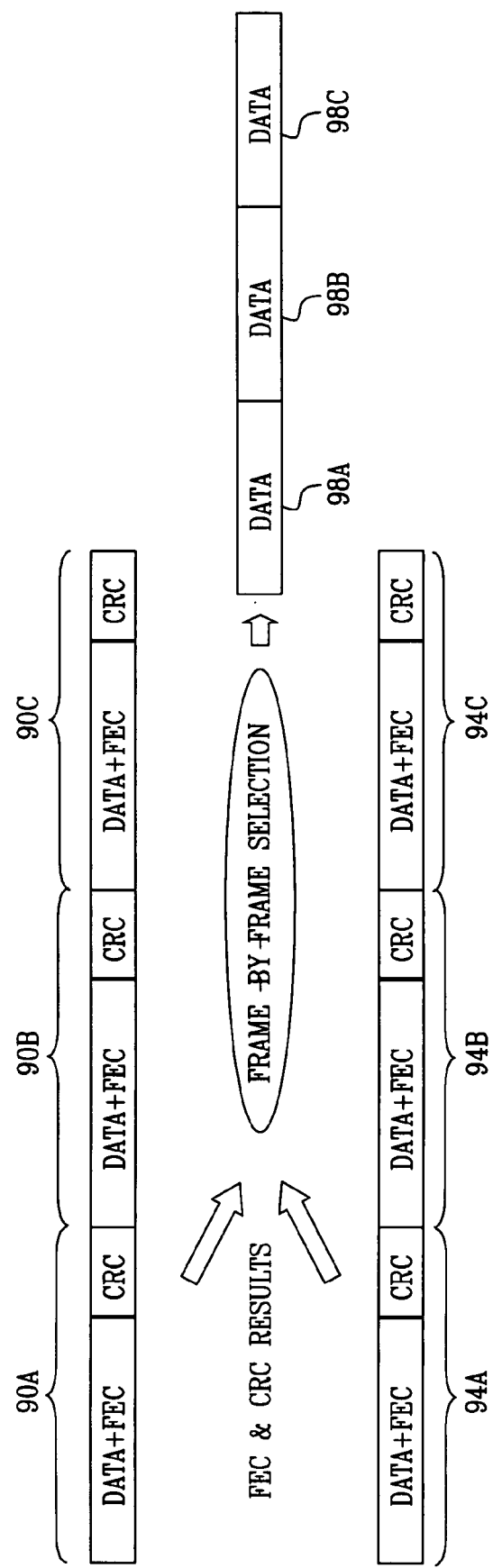
FIG. 2 is a diagram that schematically illustrates data frame processing in a receiver of a protected communication link, in accordance with an embodiment of the present invention.

FIG. 2 is a diagram that schematically illustrates data frame processing in receiver 28 of protected communication link 20, in accordance with an embodiment of the present invention. The figure shows data frames 90A ... 90C, which are produced by the primary receiver, and data frames 94A ... 94C, which are produced by the secondary receiver. Corresponding data frames in the two sequences (e.g., frames 90A and 94A, and frames 90B and 94B) carry the same data. Each data frame has a certain time interval (i.e., a certain number of symbols) allocated for data encoded using the FEC code, and another time interval allocated to CRC.

Controller 80 uses indications related to the decoding of the FEC code and the CRC in each frame in order to make frame-by-frame decisions whether to use the data frames provided by the primary receiver or the secondary receiver. The selected data frames are provided to de-framer 76, which extracts the data to produce an output sequence comprising output frames 98A ... 98C. For example, when the quality rank of data frame 90A is better than the quality rank of data frame 94A, output frame 98A comprises the data of data frame 90A.

Switching Between Primary and Secondary Links
Based on Soft Quality Ranks

It is possible in principle to compute the quality ranks of the data frames based only on binary, or pass/fail indications related to the decoding of the FEC code. For example, some Reed-Solomon (RS) decoders provide an "uncorrectable errors" indication when uncorrectable byte errors are present in the decoded block. Some iterative LDPC decoders provide a "parity satisfied" indication, which indicates whether the decoder was able to converge to a valid codeword. Some aspects of switching between the primary and secondary links based on metrics derived from FEC codes are described in U.S. patent application Ser. No. 11/483/078, filed Jul. 6, 2006, entitled "Communication Link Control using Iterative Code Metrics," which is assigned to the assignee of the present patent application and whose disclosure is incorporated herein by reference.

In some systems and scenarios, however, binary FEC code indications may be inaccurate or unreliable and may result in sub-optimal or even erroneous selection decisions. For example, the FEC decoder in one of the receivers may output a valid but erroneous codeword. In such a case, the FEC decoder will typically indicate that the decoding was successful, but the decoded data will contain errors. Such binary FEC code indications are more likely to be undependable when the FEC code rate is high, when the Signal-to-Noise Ratio (SNR) is poor and/or when multi-level FEC coding is used.

In view of the difficulties associated with FEC code indications, embodiments of the present invention provide improved methods and systems for switching between redundant links in protected link configurations. In the embodiments that are described below, controller 80 computes soft quality ranks that are related to the FEC code. The soft quality ranks have a finer resolution and lower error probability in comparison with binary FEC code indication, and therefore provide better means for selection between the primary and secondary communication links.

In some embodiments, part of each data frame is reserved for an error detection code, which is often able to provide reliable quality indications even when the FEC code fails to do so. In these embodiments, controller 80 computes the soft quality rank of each data frame based on both the FEC code and the error detection code. Note that allocating link resources (e.g., time, bandwidth) to the CRC usually causes some performance degradation, since other link parameters (e.g., symbol rate or FEC code rate) are compromised. In most cases, however, this degradation is more than compensated for by the performance improvement caused by better switching decisions. The overall link performance is thus improved.

Figure 3:
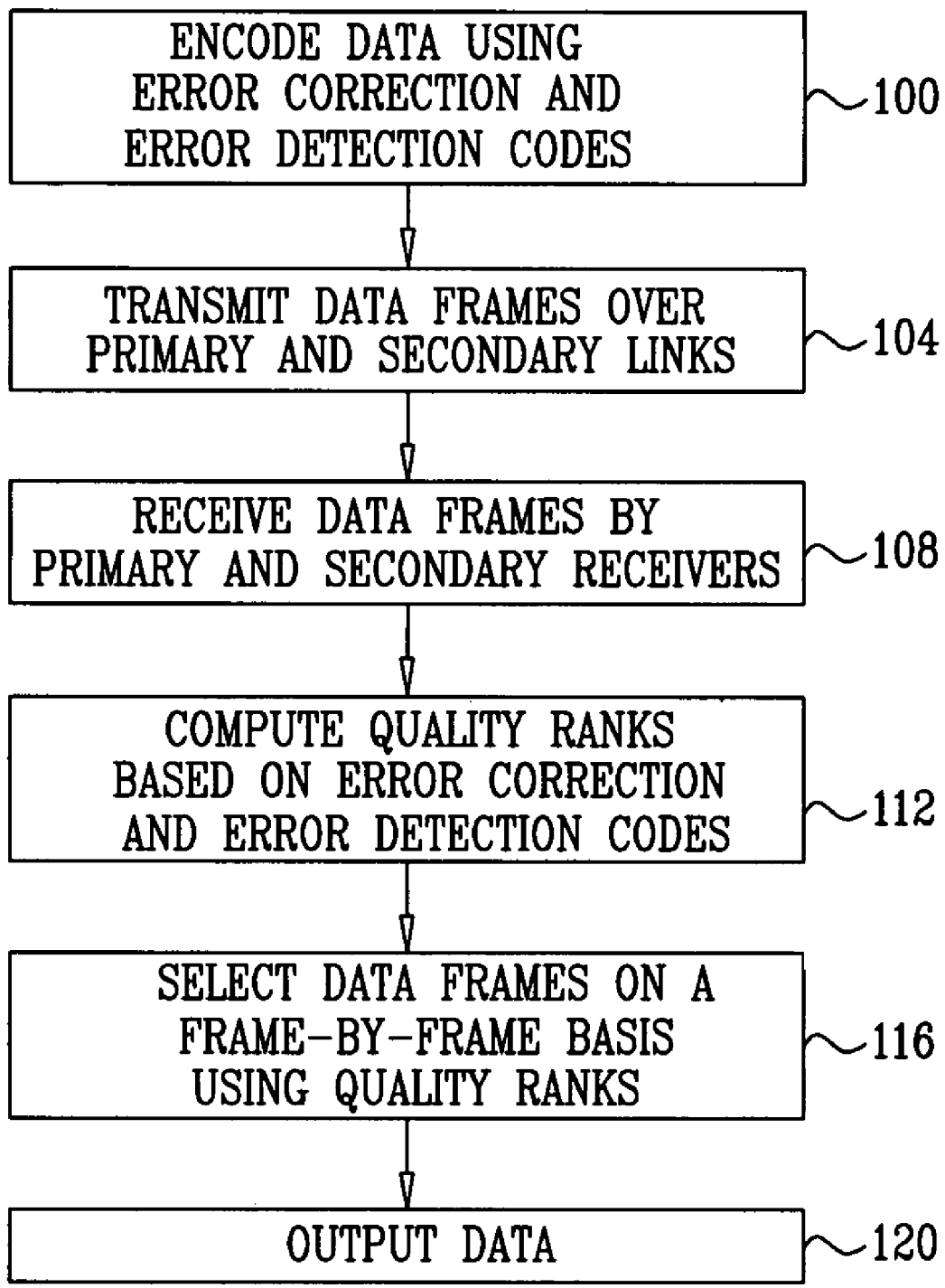
FIG. 3 is a flow chart that schematically illustrates a method for operating a protected communication link, in accordance with an embodiment of the present invention.

FIG. 3 is a flow chart that schematically illustrates a method for operating protected communication link 20, in accordance with an embodiment of the present invention. The method begins with dual transmitter 24 encoding the data using both FEC and error detection codes, at an encoding step 100. The primary and secondary transmitters transmit the data in respective sequences of data frames over the primary and secondary channels, at a transmission step 104. The primary and secondary receivers of dual receiver 28 receive and decode the signals transmitted over the primary and secondary channels, at a reception step 108, to produce two parallel sequences of data frames carrying the same data. Each of the primary and secondary RX modems produce indications related to the decoding of the FEC and error detection codes in each data frame.

Controller 80 of receiver 28 computes a soft quality rank for each data frame, based on the FEC and error detection code indications, at a rank computation step 112. Controller 80 controls MUX 72 to select the data frames from either the primary or the secondary link, at a switching step 116. The selection is typically performed in a hitless manner, frame-by-frame. The selected data frames are provided to de-framer 76, which extracts and outputs the data, at an output step 120.

Controller 80 can use any suitable indication of the FEC code, and possibly of the error detection codes, and any suitable logic based on these indications, for computing and comparing the soft quality ranks of the data frames.

Figure 4:
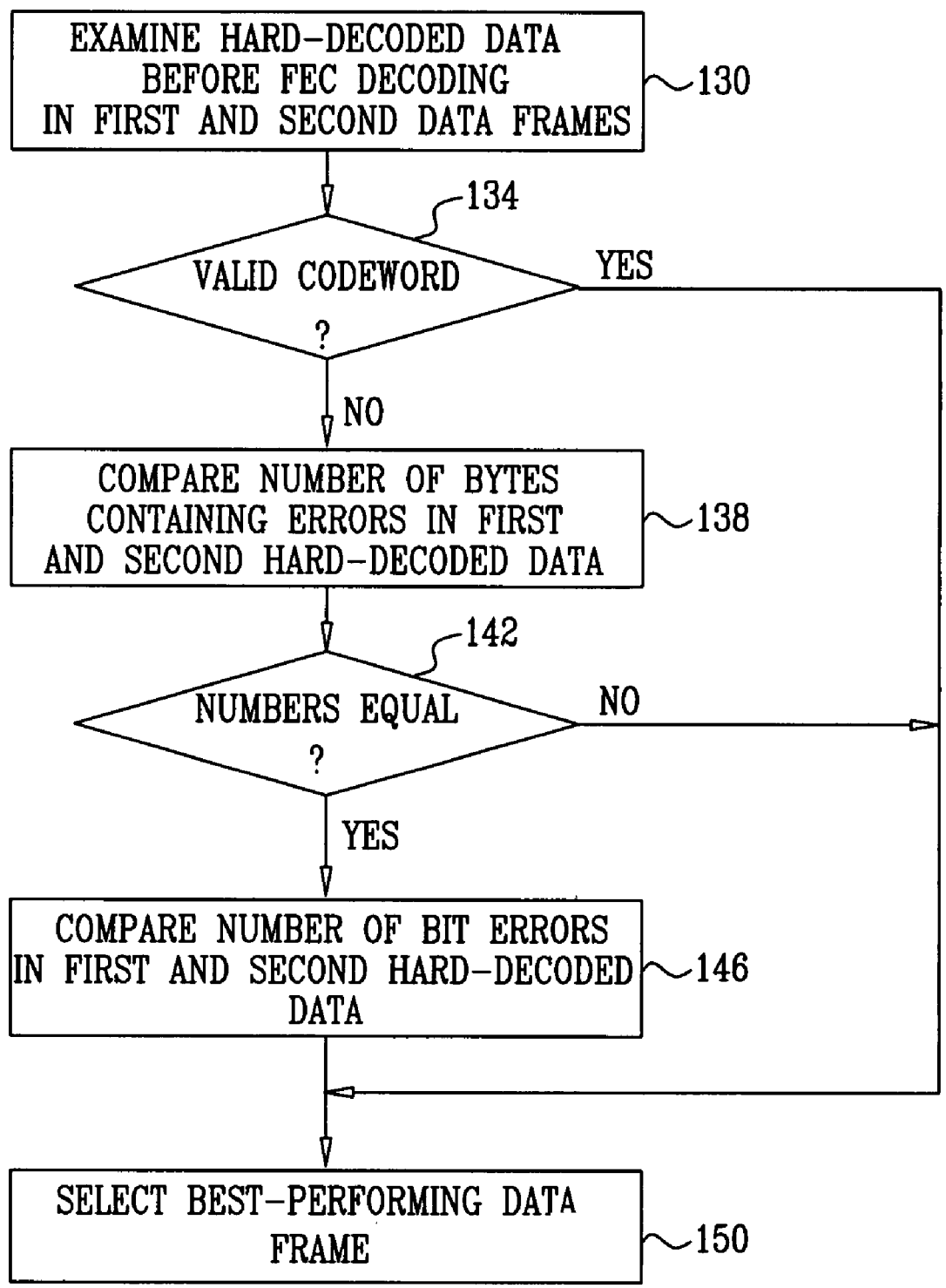
FIG. 4 is a flow chart that schematically illustrates a method for comparing data frame quality in a protected communication link, in accordance with an embodiment of the present invention.

FIG. 4 is a flow chart that schematically illustrates an exemplary method for comparing data frame qualities of two parallel data frames received from the primary and secondary receivers of link 20, in accordance with an embodiment of the present invention. The method of FIG. 4 can be used to carry out steps 112 and 116 of the method of FIG. 3 above.

The method begins with controller 20 examining the hard-decoded data, before performing FEC decoding, at a pre-decoding comparison step 130. In the present example, the bits in each data frame are divided into uncoded data bits and parity (redundancy) bits. The CRC or other error detection code is calculated over the uncoded bits in the data frame. For each of the two data frames, the controller checks whether the CRC of the uncoded bits in the frame is correct, i.e., whether the uncoded bits correspond to a valid codeword without the FEC code having to correct any errors, at a CRC checking step 134. In some embodiments, the controller checks whether the uncoded bits comprise a valid codeword directly, without evaluating the CRC. If the uncoded bits in one of the frames already comprise a valid codeword, the controller selects this frame, at a selection step 150, and the method terminates. If both frames comprise valid codewords, the controller may select any of the frames, such as maintain the MUX setting used in the previous frame.

If, on the other hand, neither frame comprises a valid codeword before FEC decoding, controller 80 selects the frame whose data is closer to a valid codeword in accordance with a certain distance metric. For example, some RS decoders provide indications as to the number of bytes that contain errors, and/or the number of bit errors corrected. The distance metric can be based on these indications. In an alternative embodiment, controller 80 can calculate the number of bit errors and/or number of error-containing bytes in a certain data frame by comparing the input and output of the FEC decoder.

In some embodiments, controller 80 checks the number of bytes containing errors in the two frames, at a byte checking step 138. If the number of bytes containing errors is not equal in the two data frames, as checked at a byte comparison step 142, the controller selects the data frame having a smaller number of error-containing bytes, at selection step 150.

If controller 80 concludes that the two data frames have the same number of bytes containing errors, the controller compares the number of bit errors in the two frames, at a bit error comparison step 146. The controller selects the frame having the fewest bit errors at selection step 150. If the number of bit errors is equal, the selection can be arbitrary according to convenience or based on any other condition. In an alternative embodiment, steps 138 and 142 above can be omitted. In other words, the controller can compare the number of bit errors without first comparing the number of error-containing bytes.

Although the embodiments described herein mainly address link configurations having a primary and a secondary link, the principles of the present invention can also be used for switching among any number of redundant links.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for communication, comprising:
receiving first and second data frames over first and second communication links, respectively, the first and second data frames containing respective first and second replicas of data, which has been encoded with a Forward Error Correction (FEC) code;
decoding the FEC code in the received first and second data frames;
computing respective first and second soft quality ranks of the first and second data frames based on the decoded FEC code;
selecting one of the first and second replicas of the data based on the first and second soft quality ranks; and
outputting the selected one of the first and second replicas of the data,
wherein computing the soft quality ranks and selecting the one of the first and second replicas comprise, when at least one of the first and second replicas does not contain errors before decoding of the FEC code, selecting one of the replicas that does not contain errors, and when both the first and the second replicas contain errors before decoding of the FEC code, selecting the one of the first and second replicas that is closer to a valid codeword of the FEC code.

2. The method according to claim 1, wherein the first communication link serves as a primary link, and wherein the second communication link serves as backup to the primary link.

3. The method according to claim 1, wherein the data in the first and second data frames is further encoded with an error detection code, and wherein computing the first and second soft quality ranks comprises computing the ranks based on both the decoded FEC code and on the error detection code.

4. The method according to claim 3, wherein the error detection code comprises a Cyclic Redundancy Check (CRC).

5. The method according to claim 1, wherein the FEC code comprises a Reed Solomon code.

6. The method according to claim 1, wherein selecting the one of the first and second replicas comprises selecting the first replica when the first soft quality rank is better than the second soft quality rank, and selecting the second replica when the second soft quality rank is better than the first soft quality rank.

7. The method according to claim 1, wherein selecting the one of the first and second replicas comprises changing a currently-selected replica when a respective soft quality rank of the currently selected replica violates a predetermined threshold.

8. The method according to claim 1, wherein the first and second soft quality ranks are based on indications derived respectively from the first and second data frames, the indications comprising at least one indication type selected from a group of types consisting of successful/failed decoding of the FEC code, a number of errors present before decoding the FEC code and a number of bytes containing the errors present before decoding the FEC code.

9. The method according to claim 1, wherein selecting the one of the first and second replicas that is closer to the valid codeword comprises selecting the one of the first and second replicas having a smaller number of the errors.

10. The method according to claim 1, wherein selecting the one of the first and second replicas that is closer to the valid codeword comprises selecting the one of the first and second replicas having a smaller number of bytes containing the errors.

11. The method according to claim 1, wherein computing the soft quality ranks comprises computing the ranks responsively to a comparison between inputs of first and second decoders that respectively decode the FEC code in the first and second data frames to respective outputs of the decoders.

12. A communication apparatus, comprising:
first and second receivers, which are arranged to receive first and second data frames over first and second communication links, respectively, the first and second data frames containing respective first and second replicas of data, which has been encoded with a Forward Error Correction (FEC) code, and to decode the FEC code in the received first and second data frames;
a multiplexer (MUX), which is operative to receive the first and second data frames from the first and second receivers and to select one of the first and second data frames, so as to provide a respective one of the first and second replicas of the data as output; and
a controller, which is coupled to compute respective first and second soft quality ranks of the first and second data frames based on the decoded FEC code, and to control the MUX to select the one of the first and second replicas of the data based on the first and second soft quality ranks,
wherein the controller is coupled, when at least one of the first and second replicas does not contain errors before decoding of the FEC code, to select one of the replicas that does not contain errors, and when both the first and the second replicas contain errors before decoding of the FEC code, to select the one of the first and second replicas that is closer to a valid codeword of the FEC code.

13. The apparatus according to claim 12, wherein the first communication link serves as a primary link, and wherein the second communication link serves as backup to the primary link.

14. The apparatus according to claim 12, wherein the data in the first and second data frames is further encoded with an error detection code, and wherein the controller is coupled to compute the first and second soft quality ranks based on both the decoded FEC code and on the error detection code.

15. The apparatus according to claim 14, wherein the error detection code comprises a Cyclic Redundancy Check (CRC).

16. The apparatus according to claim 12, wherein the FEC code comprises a Reed Solomon code.

17. The apparatus according to claim 12, wherein the controller is coupled to control the MUX to select the first replica when the first soft quality rank is better than the second soft quality rank, and to select the second replica when the second soft quality rank is better than the first soft quality rank.

18. The apparatus according to claim 12, wherein the controller is coupled to control the MUX to change a currently-selected replica when a respective soft quality rank of the currently selected replica violates a predetermined threshold.

19. The apparatus according to claim 12, wherein the first and second receivers are arranged to respectively derive from the first and second data frames indications comprising at least one indication type selected from a group of types consisting of successful/failed decoding of the FEC code, a number of errors present before decoding the FEC code and a number of bytes containing the errors present before decoding the FEC code, and wherein the controller is coupled to compute the first and second soft quality ranks based on the indications.

20. The apparatus according to claim 12, wherein the controller is coupled to select the one of the first and second replicas that is closer to the valid codeword by selecting the one of the first and second replicas having a smaller number of the errors.

21. The apparatus according to claim 12, wherein the controller is coupled to select the one of the first and second replicas that is closer to the valid codeword by selecting the one of the first and second replicas having a smaller number of bytes containing the errors.

22. The apparatus according to claim 12, wherein the first and second receivers comprise respective decoders, which are arranged to decode the FEC code in the first and second data frames, and wherein the controller is coupled to compute the soft quality ranks based on a comparison between inputs of the decoders to respective outputs of the decoders.

23. A communication link, comprising:

a transmitter, which is arranged to encode data with a Forward Error Correction (FEC) code and to transmit first and second replicas of the encoded data in respective first and second data frames over first and second communication channels; and a receiver, comprising:
first and second receiver channels, which are respectively arranged to receive the first and second data frames transmitted by the transmitter, and to decode the FEC code in the received first and second data frames;
a multiplexer (MUX), which is operative to receive the first and second data frames from the first and second receiver channels and to select one of the first and second data frames, so as to provide a respective one of the first and second replicas of the data as output; and
a controller, which is coupled to compute respective first and second soft quality ranks of the first and second data frames based on the decoded FEC code, and to control the MUX to select the one of the first and second replicas of the data based on the first and second soft quality ranks,
wherein the controller is coupled, when at least one of the first and second replicas does not contain errors before decoding of the FEC code, to control the MUX to select one of the replicas that does not contain errors, and when both the first and the second replicas contain errors before decoding of the FEC code, to control the MUX to select the one of the first and second replicas that is closer to a valid codeword of the FEC code.

* * * * *